United States Patent [19]
Boeck et al.

[11] Patent Number: 6,038,130
[45] Date of Patent: Mar. 14, 2000

[54] ELECTRICAL INTERCONNECTION SYSTEM FOR STACKABLE ELECTRONIC MODULES

[75] Inventors: Werner Boeck, Gross-Umstadt; Franz Mueller, Griesheim, both of Germany

[73] Assignee: The Whitaker Corporation, Wilmington, Del.

[21] Appl. No.: 09/029,938

[22] PCT Filed: Sep. 10, 1996

[86] PCT No.: PCT/IB96/00916

§ 371 Date: Mar. 10, 1998

§ 102(e) Date: Mar. 10, 1998

[87] PCT Pub. No.: WO97/10692

PCT Pub. Date: Mar. 20, 1997

[30] Foreign Application Priority Data

Sep. 13, 1995 [GB] United Kingdom .................... 9518697
Jun. 6, 1996 [GB] United Kingdom .................... 9611848

[51] Int. Cl.[7] .............................. H05K 7/00; H01R 13/62
[52] U.S. Cl. ......................... 361/735; 361/729; 361/731; 361/732; 361/736; 361/803; 439/289
[58] Field of Search ..................... 361/728, 729, 361/730, 731, 733, 735, 736, 796, 797, 803, 732; 439/140, 141, 289, 700, 824

[56] References Cited

U.S. PATENT DOCUMENTS 4,558,914 12/1985 Prager et al. ........................... 361/729
4,790,762 12/1988 Harms et al. ............................. 439/59

FOREIGN PATENT DOCUMENTS 0 364 618    4/1990   European Pat. Off. .
26 51 589    5/1978   Germany .
44 02 002-A1 7/1995   Germany .

OTHER PUBLICATIONS

See PCT International Search Report for any references that are not enclosed herewith.

Primary Examiner—Leo P. Picard
Assistant Examiner—John B. Vigushin

[57] ABSTRACT

An electrical interconnection system for electronic modules that are mountable on a support and stackable against other similar modules where the interconnection system allows for pivotable attachment of the modules to the support and electrical contacting with adjacent modules, such that power and data transmissions can occur therebetween, through an interconnection that protects the contacts during pivoting attachment of the module to the support and assures a reliable and easily established interconnection therebetween.

19 Claims, 9 Drawing Sheets

ELECTRICAL INTERCONNECTION SYSTEM FOR STACKABLE ELECTRONIC MODULES

BACKGROUND OF THE INVENTION

1. Field of the Invention

This invention relates to a mounting system, and an electrical connection system for electronic modules that fit together in a juxtaposed manner to form a stack of electrically interconnected electronic modules.

2. Summary of the Prior Art

In certain industries it is known to provide electronic modules that are mountable and electrically interconnectable and form an electronic device that controls an industrial robot, or industrial measurement systems, for example along a manufacturing chain. These electronic modules act as a local computing device that reduce the cabling requirements from an operating station (e.g. robot) to a central computer. Due to the variety of processes that the electronic modules control, they are stackable in different combinations to form a computing subassembly. Such a module is described, for example, in DE 44 02 002 A1 and EP 364 618. It is advantageous to provide modules as they can be easily replaced, either in the case of malfunctioning, or when modification to the process or electronic control is desired.

It is known to provide a support, such as a U-shaped metal profile, to which the electronic modules are mounted and stacked one against each other. One means of stacking the modules together is by slidably interengaging the loose modules to a stack already fixed to a rail or support, as shown in DE 44 02 002 A1. Due to the long linear sliding movement, it is sometimes difficult to remove centrally placed electronic modules. The contacts that extend through the side surface of the electronic module, for connection to contacts of the adjacent module, rub against the adjacent module during the mounting procedure. The long mounting travel causes excessive rubbing of the contact surfaces. Excessive wear of the contact surfaces, which are usually gold-plated, may impair their functioning.

In certain industrial applications, for example along an automobile production line, production stoppages are extremely expensive, and therefore the time required to replace components, or caused by malfunctioning of stacked electronic modules, must be avoided.

SUMMARY OF THE INVENTION

It would be desirable to provide an electronic module mounting system and electrical connection system that is robust, reliable and enables easy replacement of designated modules.

It is an object to provide a module mounting and electrical interconnection system that allows easy replacement of modules, but is nevertheless robust and provides reliable electrical interconnection between stacked modules.

It is an object to provide a module mounting and electrical interconnection system where the electrical interconnection is protected from wear and damage, the module nevertheless being easily stackable.

It is an object to provide a module mounting and electrical interconnection system for stacked mounting against other modules, that is not only robust and reliable, but that is cost-effective to produce and is compact.

Certain objects have been achieved by providing an electronic module mounting and electrical interconnection system comprising a housing within which electronic and electrical components of an electronic module are mounted, the housing having a mounting section adapted for pivoting movement about an axis substantially parallel to the stacking direction of a plurality of modules, the mounting and connection system further comprising an electrical connector section having electrical terminals protruding beyond a side surface of the module and engageable against complementary terminals of an adjacent electronic module. For retaining adjacent modules together, the module has a wall portion extending alongside the side surface and separated therefrom by a recess that receives a wall portion of an adjacent module therein, the adjacent modules being stackable together by approaching a first module with a second module in abutment against each other but at different angles, subsequently pivoting the module until full engagement with the support, whereby during the pivoting motion the locking wall portions interleave for retaining the modules together in the stacking direction.

Advantageously, the interengaging wall portions provide a robust and precise retention feature for the stacked modules, whereby the limited pivoting movement and interleaving wall portions provides a precise and robust but nevertheless easy to handle interconnection and mounting system.

Certain objects have been achieved by providing an electronic module mounting and electrical interconnection system comprising a housing within which electronic and/or electrical components are mounted, the housing having a mounting section for mounting on a support in a stacked relation against another adjacent module, the interconnection system comprising an electrical connector having a plurality of biasable electrical contacts protruding beyond a side surface of the module towards an opposed surface of the adjacent module, the connection system further comprising a resiliently movable contact guard engaging the contacts such that biasing of the guard in towards the module, biases the contacts in towards the module for protection thereof.

Advantageously, contact surfaces are inwardly biased when a foreign object, for example an adjacent module, abuts against the side wall of the module. Rubbing of contact surfaces, or other damage due to abutment with external objects, is thus avoided.

Certain objects have been achieved by providing an electronic module mounting and electrical interconnection system comprising a housing within which electronic and electrical components (such as a printed circuit board) are mounted, the housing having a mounting section for mounting on a support in a stacked relation against an adjacent module, the module further comprising electrical contacts interconnecting one side of the module to another side of the module, the opposed sides being adjacent other modules stacked thereagainst for interconnecting data and power signals of the adjacent modules, each of the electrical contacts being integral and extending from one side of the module to the other side, the contacts having on one side a substantially immoveable portion, and a resilient biasable portion extending therefrom to the other side. The contacts may further comprise a connection portion for mounting on a printed circuit board (PCB).

Advantageously, a compact and cost-effective stackable electronic module is provided.

Further advantageous features will be apparent from the following description and the claims.

BRIEF DESCRIPTION OF THE DRAWINGS

FIG. 13 is a partial cross-sectional view of two modules that are stackable together, but shown slightly separated apart;

FIG. 14b is a view in the direction of arrow 14b of FIG. 14a;

FIG. 14c is a view in the direction of arrow 14c of FIG. 14a;

FIG. 17b is a view in the direction of arrow 17b of FIG. 17a; and

FIG. 17c is a view in the direction of arrow 17c of FIG. 17a.

DETAILED DESCRIPTION OF THE PREFERRED EMBODIMENT

Figure 15:
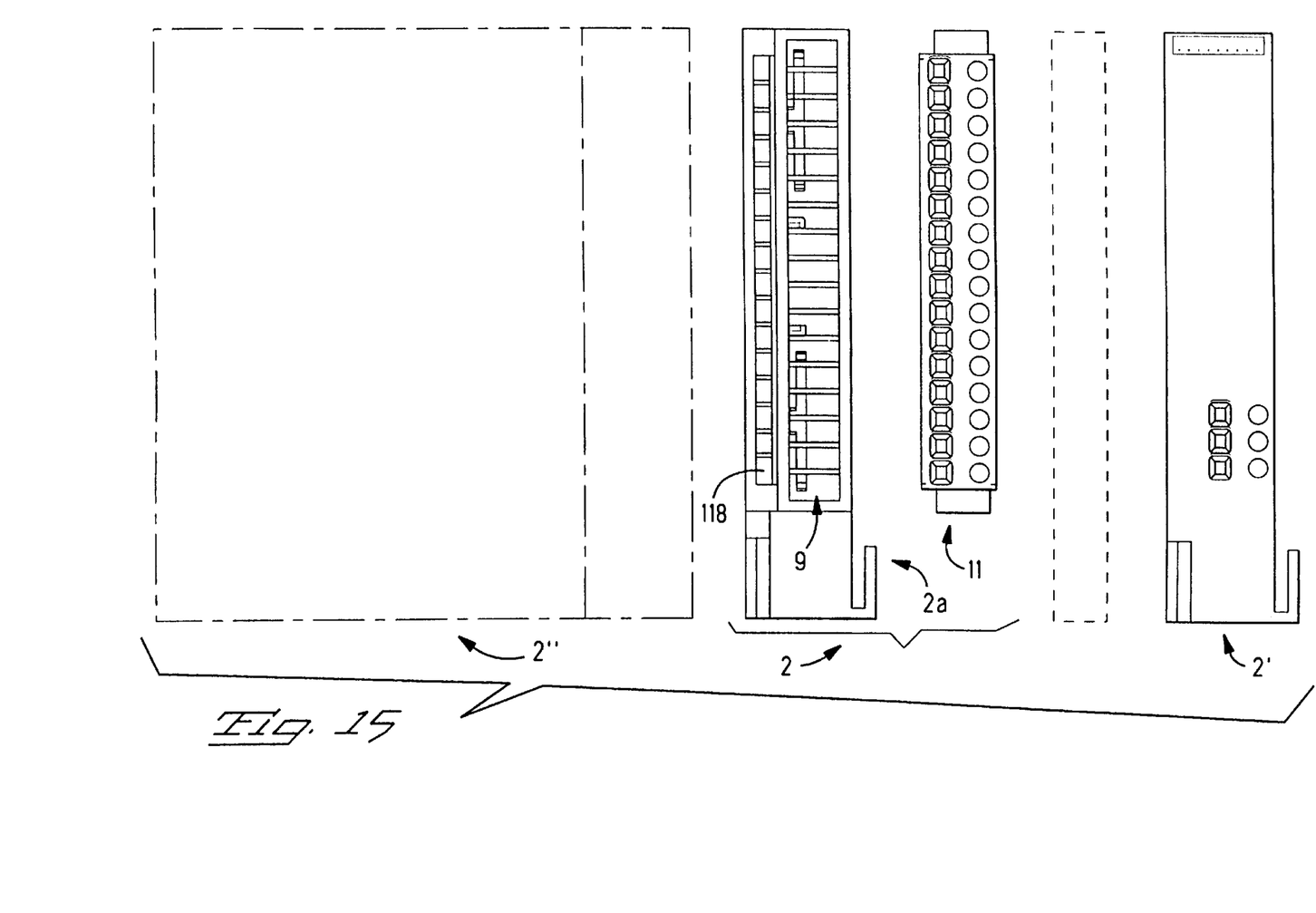
FIG. 15 is a schematic exploded view of various electronic modules stackable together.

Referring to FIGS. 1–8, an electronic module 2 is shown comprising a mounting section 3, an electrical interconnection section 5, an electronic component section 7, a connection section 9, and a pluggable connection interface 11 (see FIG. 15).

Figure 16:
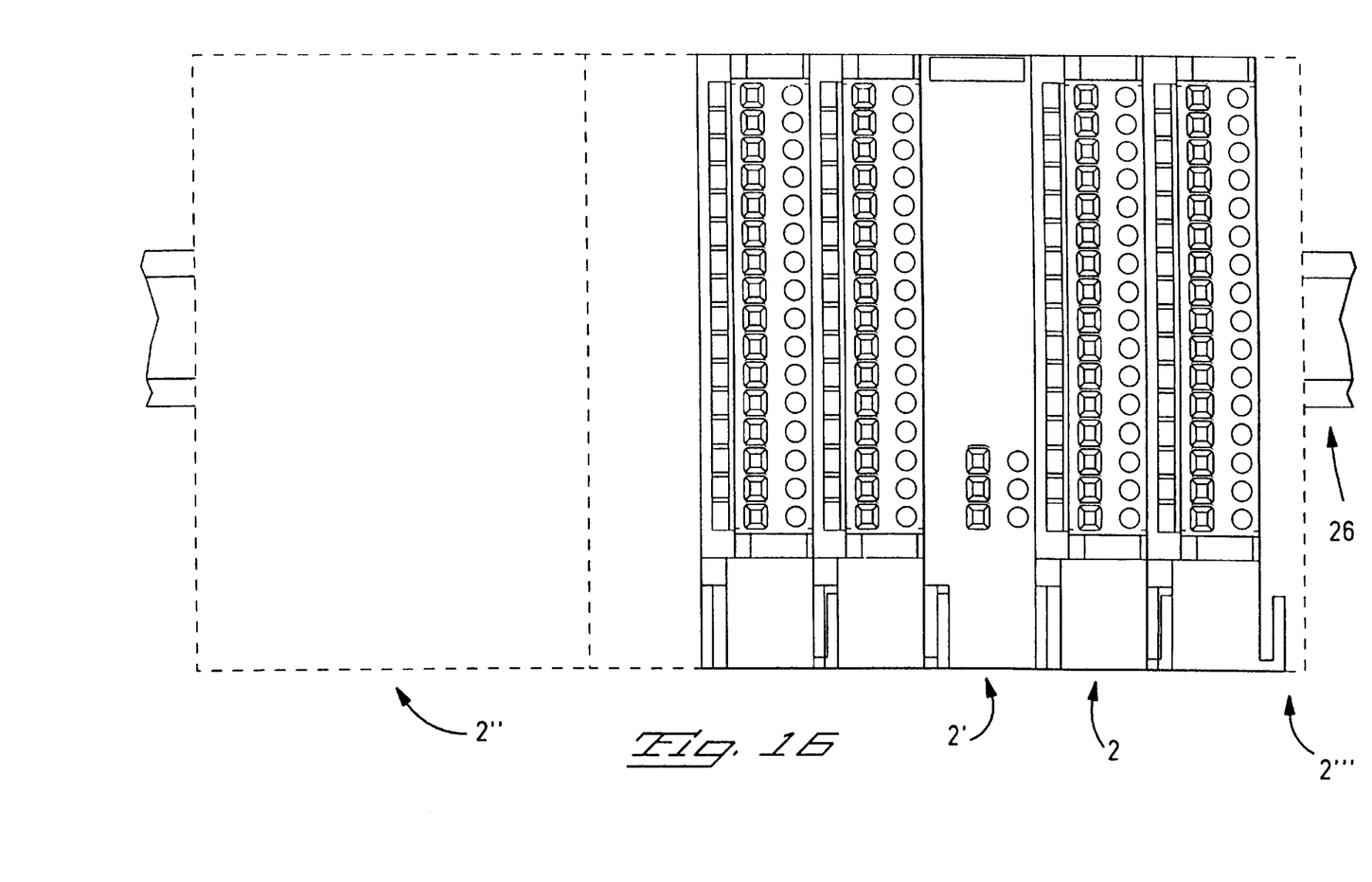
FIG. 16 is a schematic view showing a number of modules stacked together and mounted on a support.

Referring now to FIG. 15 and 16, an example of stacked electronic modules 2,2',2",2'" is shown. The module 2, is for example an input/output (I/O) module, the module 2' is a power module for supplying power to the stacked modules, and the module 2" is a mini computer with a central processing unit for processing the signals of the modules and interconnecting them to a field bus. As shown in FIG. 16, such a group of modules are stacked together and mounted on a support rail 26. It is of course possible to combine a variety of different modules together in order to accomplish the desired functions. In order to work together, the modules must be interconnected by a common electrical interconnection system that allows power and data signals to traverse the modules. The module 2'" is not really a module, but a cover member mounted over the end module in a group of modules.

Referring to FIG. 15, an I/O module 2 is shown comprising a main body portion 2a comprising the connection section 9, and the pluggable interface section 11 that can be pluggably connected to the connection section 9. The pluggable interface section 11 provides a connection interface for connecting conducting wires to the I/O module, and can be provided with different configurations such that the pluggable interface sections can be exchanged for different I/O module configurations without the need for producing or installing a separate main body 2a. The latter in particular enables different conductor shapes, sizes and numbers, for example, to be connected to an I/O module by simply providing the suitable interface section, but not changing the main body 2a.

Figure 1:
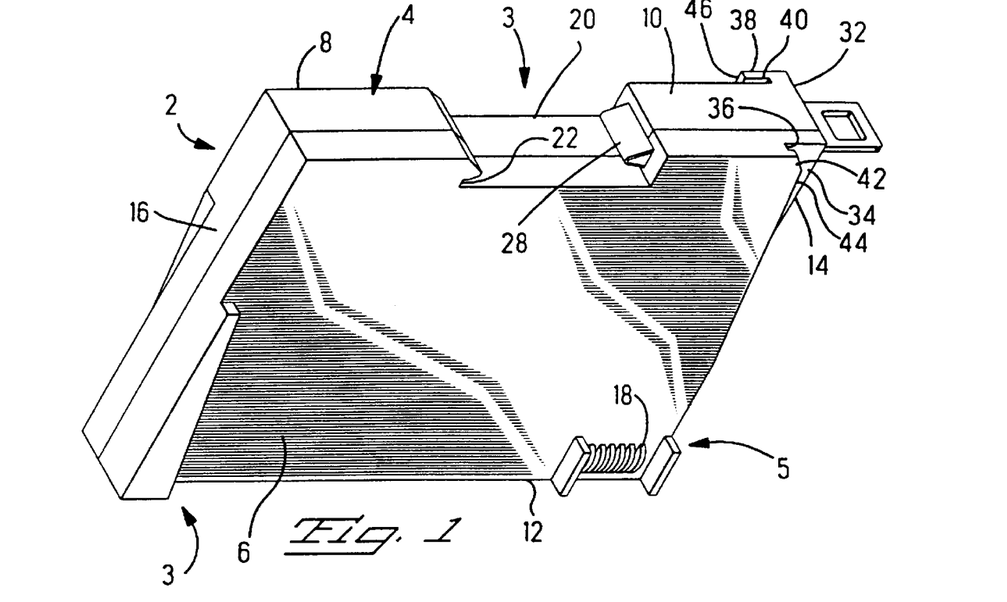
FIG. 1 is a perspective view of an electronic module according to this invention.

Referring to FIG. 1, the electronic module 2 is shown comprising a housing 4 with a first side wall 6, an opposing side wall 8, a top wall 10, a bottom wall 12 opposed thereto, a first end wall 14 and a second end wall 16 opposed thereto. The housing 4 has electrical and electronic components of the electrical component section 7 mounted therein. Proximate the corner joining the first end wall 14 and the bottom wall 12 are a plurality of juxtaposed electrical contacts 18 of the electrical interconnection section 5 that project beyond the second side wall 6. The contacts 18 are resiliently biasable towards the side wall and project through slots in the side wall for connection to the electronic component section 7 within the module. The contacts 18 bias against complementary contacts on the second side wall 8 of an adjacent module 2' when mounted thereagainst, for interconnecting the electronic and electrical components of the stacked modules.

The mounting section 3 comprises a U-shaped recess 20, interlocking wall corner portions 38,40,34,42,39,41,35,43, and a latch member 28. The substantially U-shaped recess 20 is provided at the top wall 10 and has on one end a groove 22 for receiving an edge 24 (see FIG. 2) of a U-shaped profile 26 that serves as a support for mounting of electronic modules. On the opposing end of the recess, is the resiliently biasable latch member 28 that can be clipped over a second opposing edge 30 of the support 26 for secure mounting and retention of the electronic module to the support.

Figure 2:
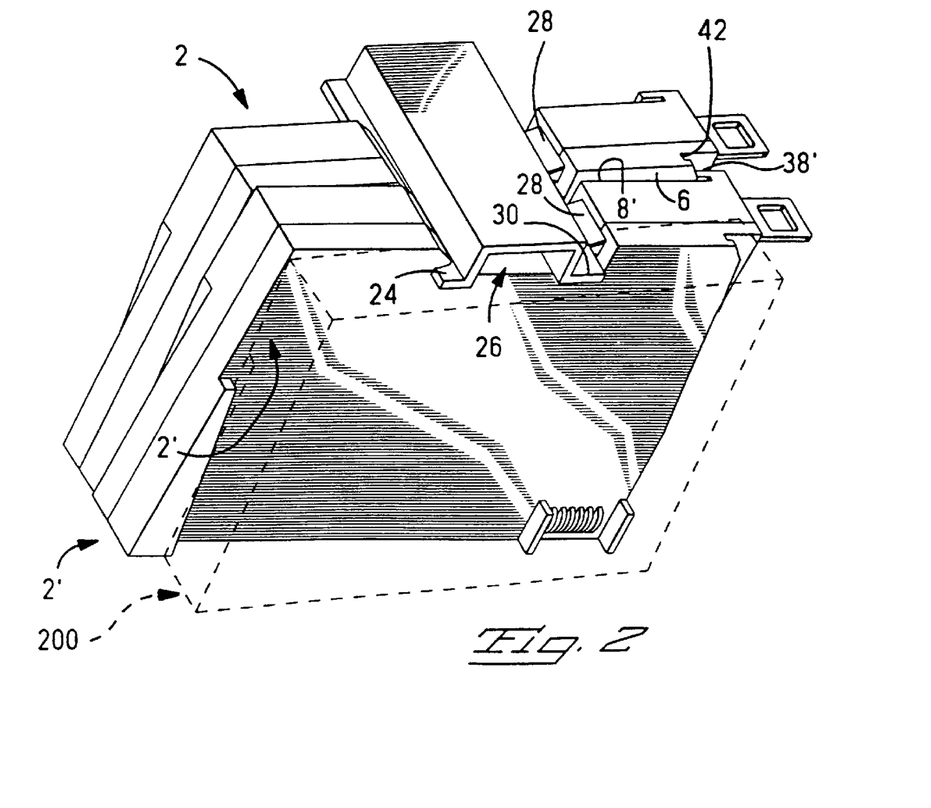
FIG. 2 is a perspective view of an electronic module mounted to a support, and a second electronic module in the process of being stacked to the first electronic module.
Figure 3:
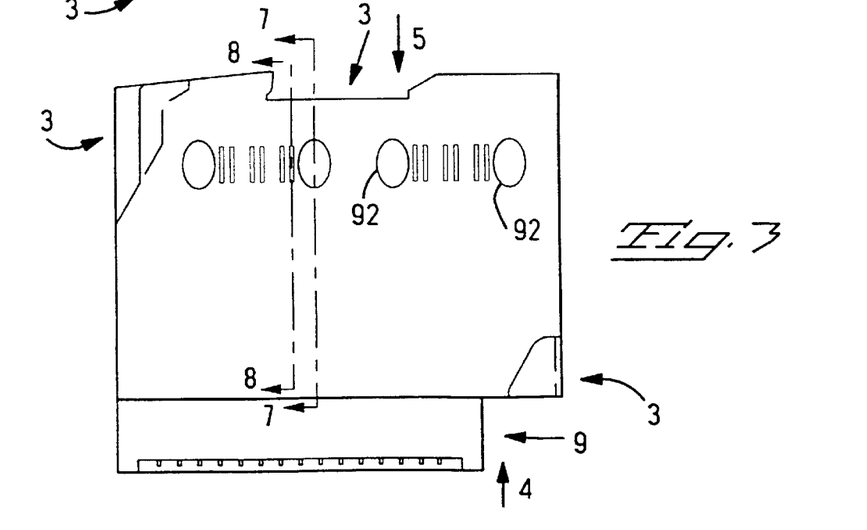
FIG. 3 is a plan view of one side of an electronic module according to this invention.

On the second side wall 6, proximate an upper corner 32 that joins the first end wall 14 to the top wall 10, is a recessed wall portion 34 substantially parallel to the side wall 6 and forming a slot or groove 36 therewith for interleaving engagement with a complementary wall portion 38 of an adjacent module that is stacked against the side wall 6. The complementary wall portion 38 extends substantially parallel to the second side wall 8 and is spaced therefrom to provide a slot or groove 40 for receiving a projecting wall portion 42 of the first side wall of an adjacent module. The projecting wall portion 42 extends over the recessed wall portion 34 to form the groove 36. An outer edge 44 of the wall portion 42 and an outer edge 46 of the wall portion 38 have complementary profiles that enable adjacent modules to be mounted at a slight angle with respect to each other as shown in FIG. 2, such that a first side wall 6 of a first module 2 abuts a second side wall 8' of an adjacent module 2'. The first module 2 is first mounted to the support 26 in a secure manner such that the resilient latch 28 engages the support edge 30, whereby the second module can then be slid along the U-profile where the mounting groove 22 is engaged with the U-profile edge 24 until abutment of the adjacent side walls. The module can also be inserted between two modules 2,200 as illustrated in FIG. 2 by tilting it at an angle. The second module 2' can then be pivoted such that the resilient latch 28' latches over the support edge 30, and simultaneously the wall portion 38' engages behind the wall portion 42 of the adjacent module 2. Interengagement of the wall portions 38',42 ensure secure retention of the modules in the sliding direction, and further enable accurate positioning of the modules together with reduced play. The provision of interleaving wall portions at opposed corners of the module enable the modules to be extracted from a stack by a small pivoting/tilting movement to disengage, and then simply pulling it away.

Advantageously therefore, the small pivoting movement that disengages the module, which can then be removed by simply pulling the tilted module away from between adjacent modules, provides for a very simple and easy removal and replacement of the module, whilst nevertheless ensuring a robust and accurate stacking together.

Figure 4:
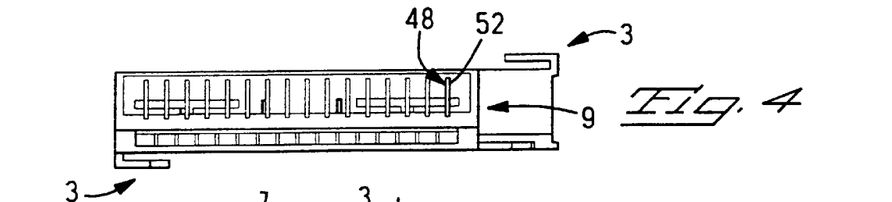
FIG. 4 is a view in the direction of arrow 4 of FIG. 3.
Figure 5:
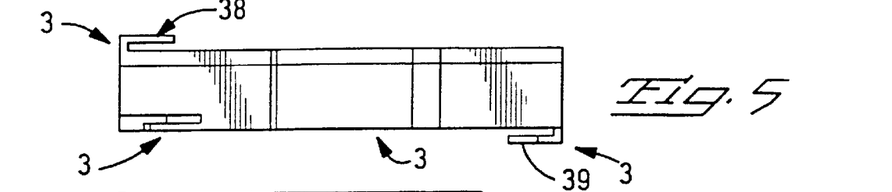
FIG. 5 is a view in the direction of arrow 5 of FIG. 3.
Figure 6:
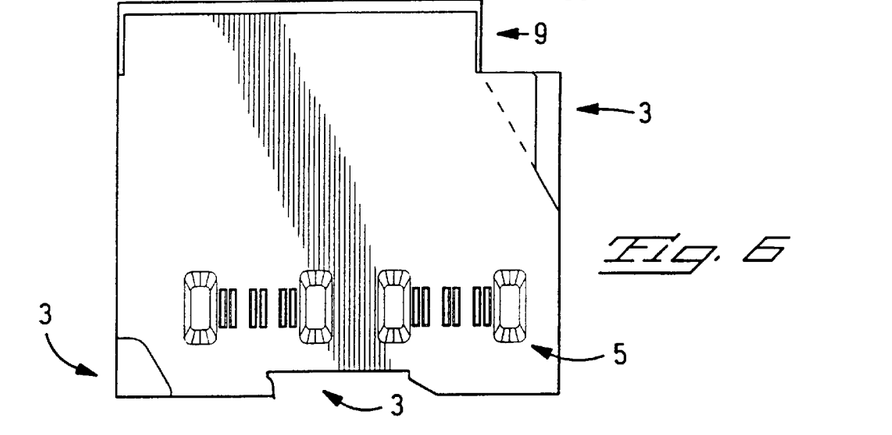
FIG. 6 is a plan view of the other side of the module of FIG. 3.
Figure 7:
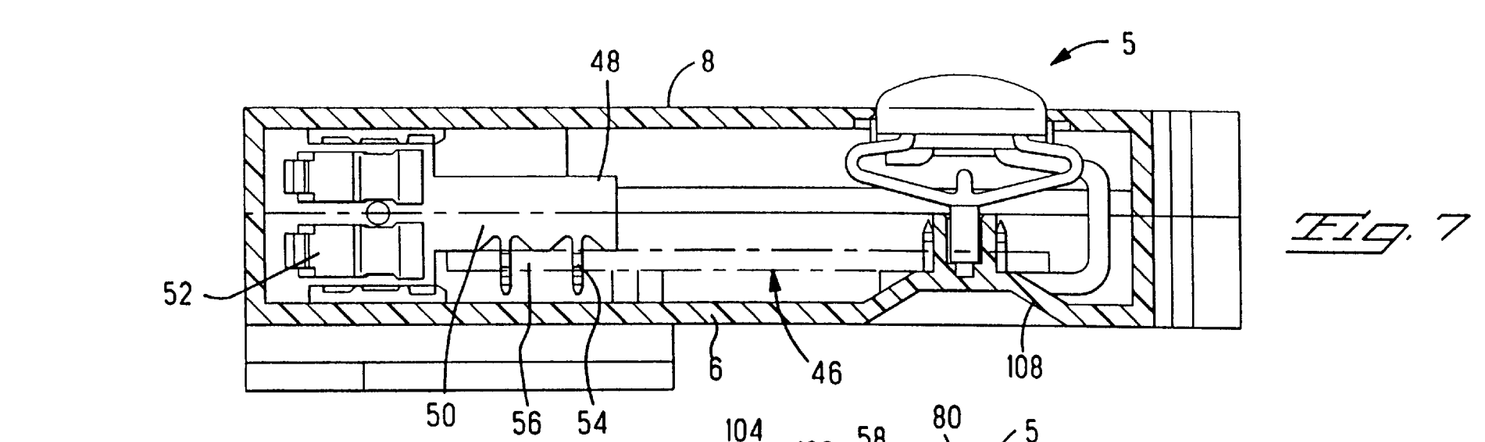
FIG. 7 is a cross-sectional view through lines 7—7 of FIG. 3.
Figure 8:
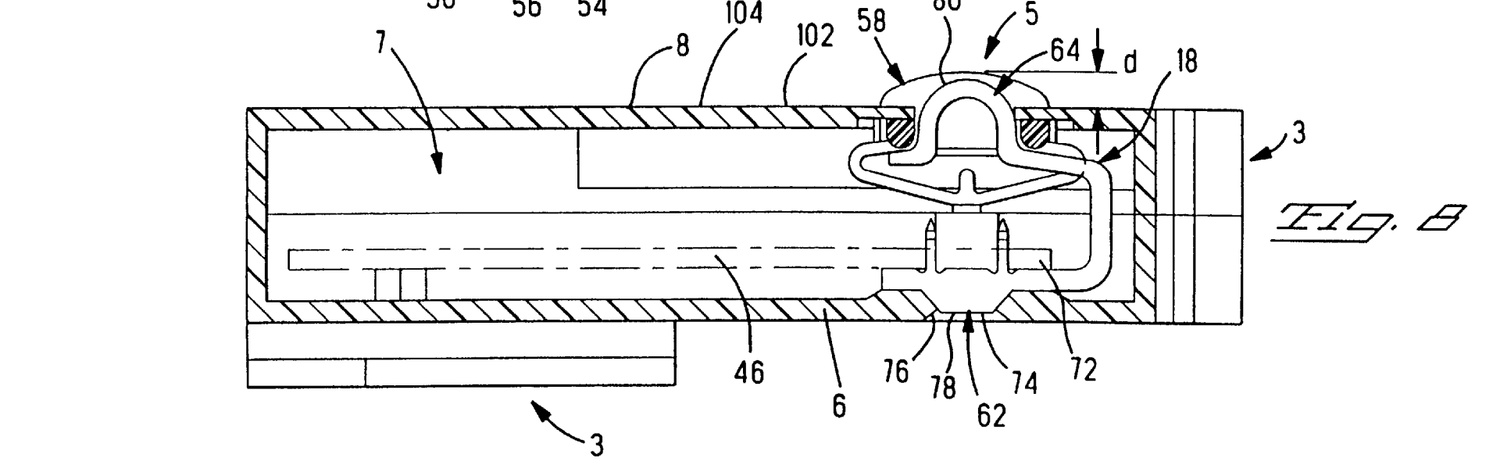
FIG. 8 is a cross-sectional view through lines 8—8 of FIG. 3.

Referring to FIGS. 4, 7 and 8, the electronic component section 7 comprises a PCB 46 extending substantially parallel to the housing side walls 6,8, and having electrical circuit traces thereon interconnecting electrical and electronic components (not shown) mounted on the PCB. For certain modules, the PCB 46 may comprise no electronic components mounted thereon, but just serve for the distribution of electrical signals. The connection section 9 comprises a plurality of stamped and formed contacts 48 having a PCB connection section 50 and a pluggable mating section 52 that, in this example, comprises flat tabs directed towards the bottom wall 12 of the module for plugging connection with complementary receptacle terminals mounted in the pluggable interface section 11. A plurality of the contacts 48 are mounted in a juxtaposed manner as shown in FIG. 4. The PCB connection section 50 comprises compliant pin contacts 54 mounted in plated through holes at an interface end 56 of the PCB 46. The contacts 48 are substantially planar edge-stamped parts that are compact and cost-effective to manufacture.

Referring to FIGS. 7, 8, 14*a*, 14*b*, and 14*c* the electrical interconnection section 5 comprises a plurality of the substantially planar stamped and formed contacts 18, and a contact guard 58. The contacts shown in FIGS. 14*a*–*c* differ slightly from the contacts shown in the other Figures, but the principal features and their functioning is essentially the same. Each contact 18 comprises a PCB mounting portion 60, a fixed contact section 62, a biasable contact section 64 opposed to the fixed contact section, a spring section 66 extending between the contact sections, and a free end extension 68 extending from the biasable contact section 64. The mounting section 60 comprises compliant contact pins 70 that are mountable in plated through holes at an interconnection end 72 of the PCB 46. The fixed contact section 62 comprises a substantially flat contact surface 74 directed away from a PCB mounting surface 76 of the mounting section 60 at a distance sufficient to project through slots 76 extending through the housing side walls 6 (see FIG. 8) such that the contact surfaces 74 are exposed to the exterior of the electronics module. The contact surface 74 is positioned slightly recessed with respect to the outer surface 78 of the side walls 6 such that it is protected from damage. The biasable contact section 64 comprises a convex arcuate contact surface 80 for biasing against the contact surface 74 of an adjacent module, as best understood by looking at FIG. 13.

Figure 14A:
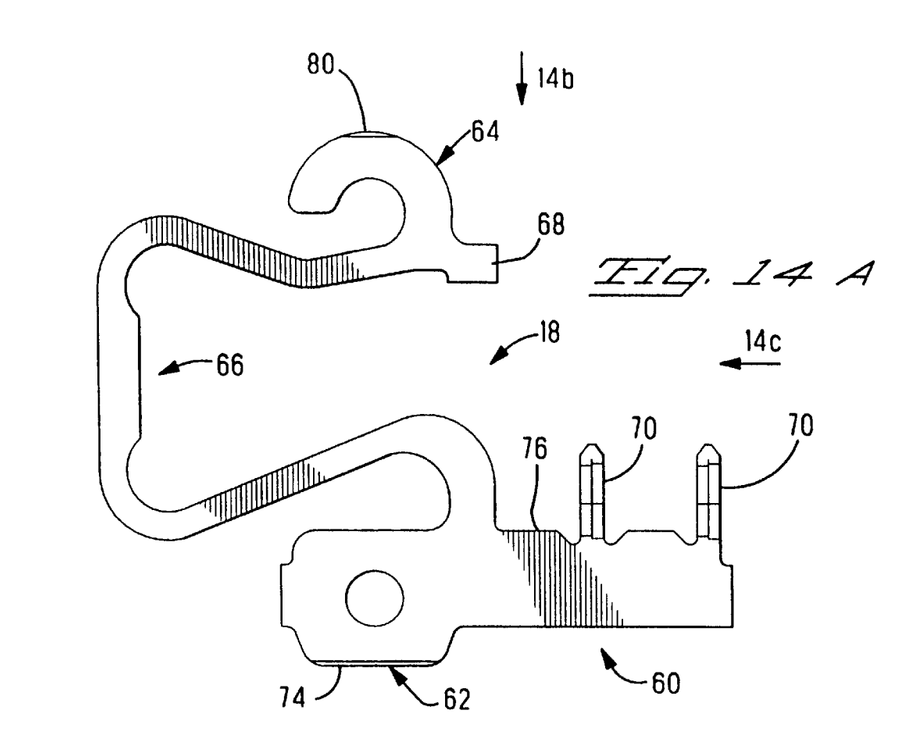
FIG. 14a is a plan view of a contact of the interconnection system according to this invention.
Figure 14B:
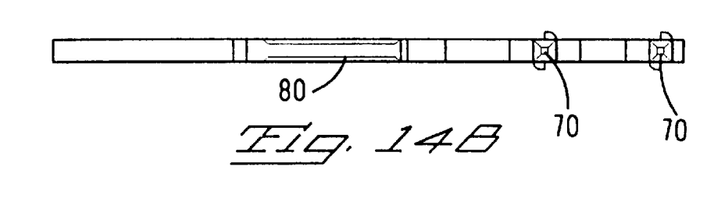
Figure 14C:
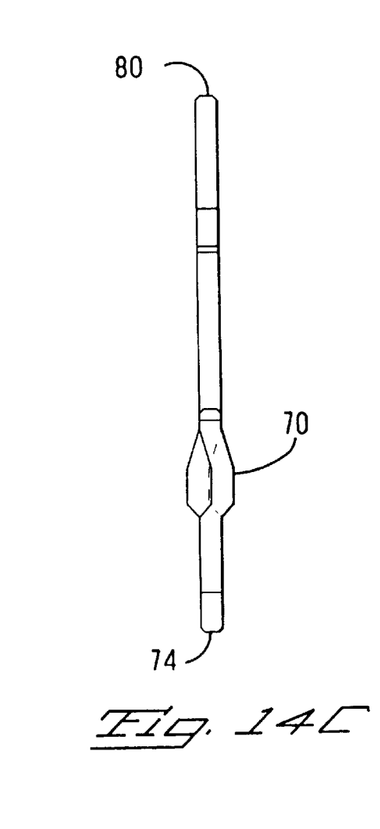

The large substantially flat (linear) contact surface 74 in combination with the convex contact surface 80 enables a not only certain degree of tolerance in the mispositioning of adjacent modules, but also some contact rubbing. By virtue of the substantially U-shaped spring section 66 extending across the width of the module, the contact section 64 can be resiliently biased with large travel and substantially constant spring pressure for ensuring reliable contact pressure between the mating biasable and fixed contact sections. The spring section 66 also enables the opposed contact sections 62,64 to be joined together in an integral part that extends from one side wall 6 to the other side wall 8 for allowing data and signal connections to traverse the modules in a cost-effective, compact and reliable manner. Furthermore, the substantially planar edge-stamped contacts are particularly cost-effective to manufacture and easy to mount on the edge of a PCB due to the disposition of the mounting section proximate the fixed contact section 62, also enabling a particularly compact, juxtaposed assembly. Another advantage is that the electrical resistance between a stack of modules is reduced by the direct interconnection from one side of the module to the other through the contacts. The latter is particularly advantageous when a large number of modules are stacked together. Assembly forces (e.g. to stitch the contacts to the PCB) can be applied to the relatively rigid mounting or fixed contact sections.

Referring mainly to FIGS. 7–12, the contact guard 58 comprises a mounting portion 82, a guard portion 84, and an intermediate section 86 extending therebetween. The mounting portion 82 comprises a pair of studs 87 mountable in complementary holes at the interconnection end 72 of the PCB 46. Extending from either mounting stud 87, are diamond-shaped arms (i.e. V- or U-shaped arms in mirror-image symmetry) 89 that position/hold the guard portion 84 with respect to the mounting studs 87. The intermediate section 86 further comprises an anti-overstress stud 90 projecting from the mounting portion towards the guard portion to limit biasing of the guard portion towards the mounting portion. The guard portion 84 comprises elliptically-shaped protrusions 92 extending above the arms 89. The guard portion further comprising a base plate 94 extending between the pair of protrusions 92 and having an upper stop surface 96 and lower spring engagement surfaces 98 that are recessed with respect to a lower surface 100, thereby forming recesses 99. The upper stop surface 96 abuts an inside surface 102 of the housing side wall 8 (see FIG. 8) for limiting outward biasing of the guard portion 84.

Figures 9, 10:
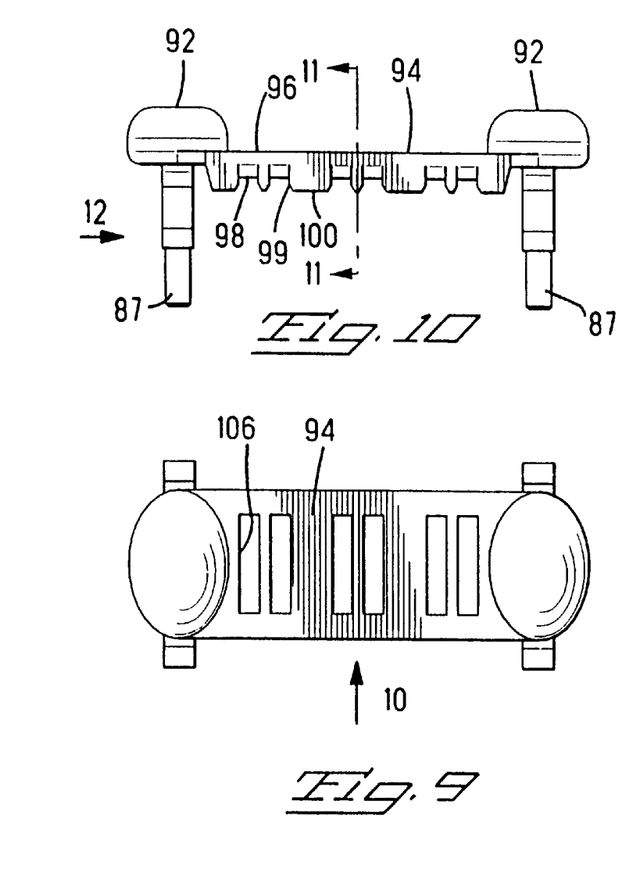
FIG. 9 is a plan view of a contact guard.
FIG. 10 is a view in the direction of arrow 10 of FIG. 9.
Figure 11:
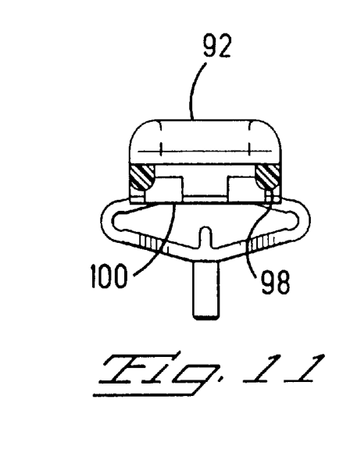
FIG. 11 is a cross-sectional view through lines 11—11 of FIG. 10.
Figure 12:
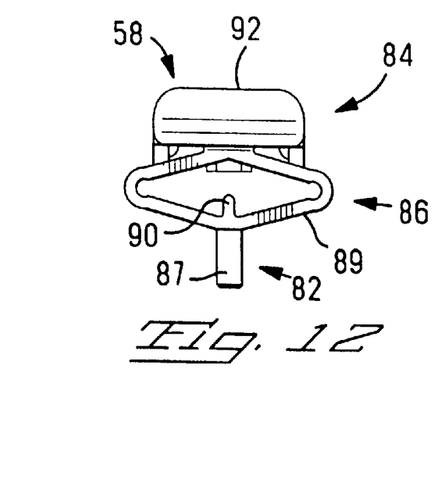
FIG. 12 is a view in the direction of arrow 12 of FIG. 10.

Each of the protrusions 92 extend through a cutout in the side wall 8 thereby extending at a distance D from the outer surface 104 of the side wall 8. Within the recesses 99, are received the free ends 68 of the contact 18 that bias against the abutment surface 98 in such a manner that the convex contact surface 80 is positioned below the protrusion 92 as best seen in FIG. 8. As seen in FIG. 9, the base section 94 has slots 106 to allow biasing of the contact sections 64 therethrough.

If an object passes over the outer surface 104 of the side wall 8, such as the adjacent side surface 6 of an adjacent module, abutment against the guard protrusions 92 will cause it to bias with the contacts into the electronic module housing. During stacking or removal of modules, therefore, the contact surfaces 80 do not rub against the adjacent wall of the adjacent module and are thereby protected from wear and damage. Resiliency of the guard can be provided principally by the contacts 18, but some may also be provided by the intermediate section 86.

In order to enable engagement of the contact surface 80 of the biasable contact section 64 with the fixed contact section 62 of the adjacent electronic module, complementary recesses 108 are provided in the side walls 6 for receiving the protrusions 92 therein when adjacent modules are fully assembled together. Adjacent, biasable and fixed contacts are thus biased together for electrical contact therebetween.

The elliptical shape of the protrusions 92 of the guard, allow smooth easy inward biasing. Furthermore, as the protrusions enter the recesses 108, contact between the biasable contact and the fixed mating contact occurs prior to the fully assembled position such that a small amount of rub between contacts is provided. The latter ensures that dirt or layers of other substances that may disturb the electrical contact surfaces, are removed.

Figure 17:
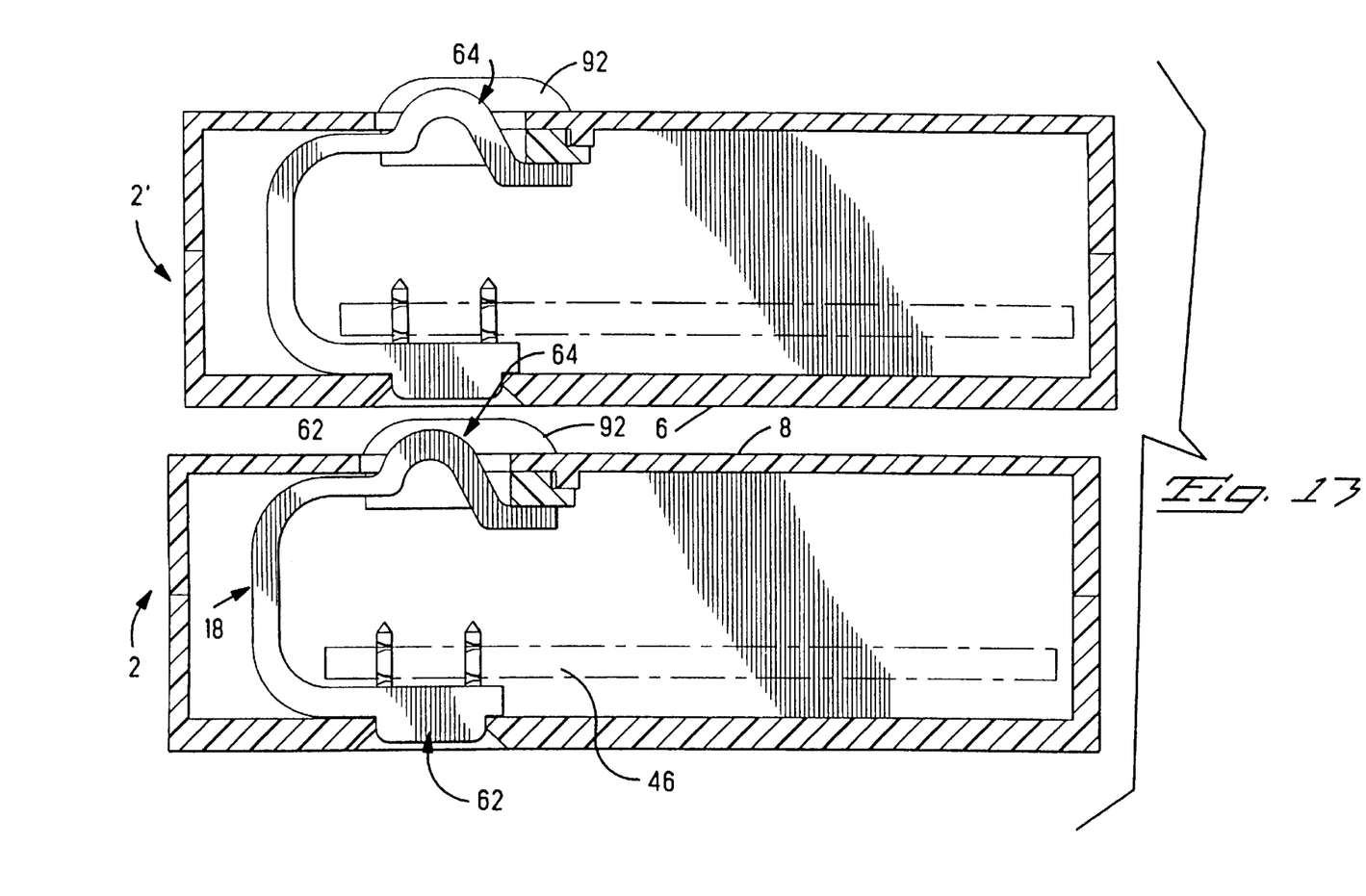
Figure 17A:
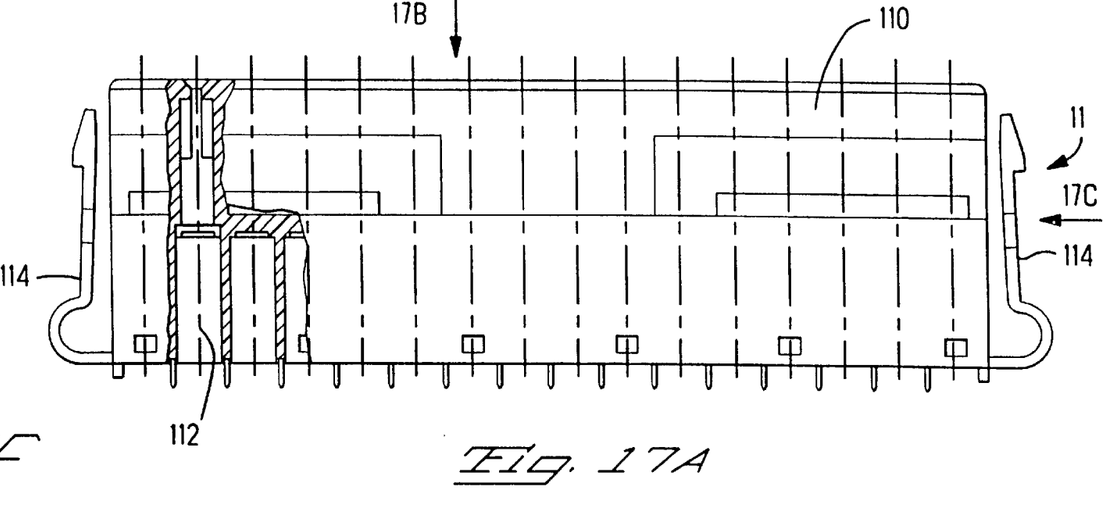
FIG. 17a is a partial cross-sectional view of a pluggable connection interface.
Figure 17B:
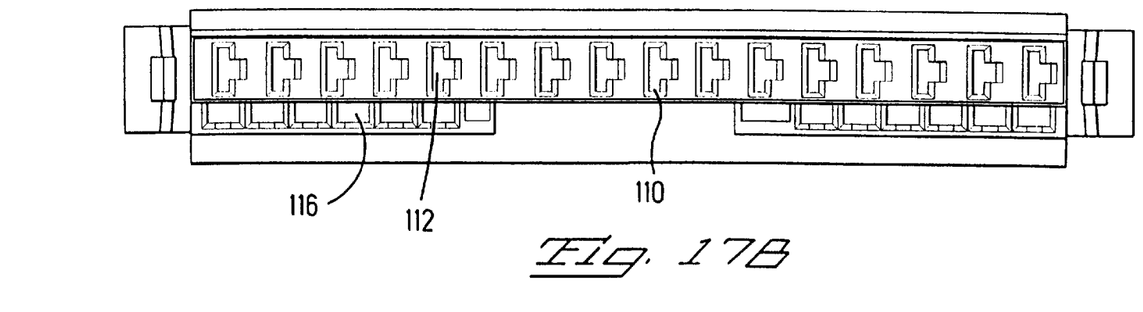
Figure 17C:
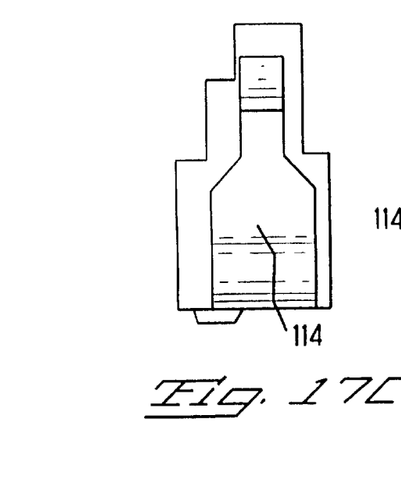

Referring now to FIGS. 17a–17c, a housing 110 of the pluggable interface section 11 is shown comprising a plurality of cavities 112 for receiving terminals therein. The terminals are for pluggable connection to the module connection section contacts 48 (see FIG. 7) on the one end, and for connection to complementary conductors or terminals of cables to be connected to the electronic module on the other end. Different configurations of cavities and terminals can be provided for mating to the same connection section 9. Resilient latching members 114 are provided on either end of the housing 110 for latching to the housing of the electronic module. The pluggable interface section 11 can thus be rapidly removed and replaced. The housing 110 may also be provided with a slot 116 for receiving light emitting diodes (LEDs) 118 (see FIG. 15) that indicate the on/off activity of the various connections.

We claim:

1. An electronic module mounting and electrical interconnection system having an electronic module comprising a mounting section, an electrical interconnection section, an electronic or electrical component section, and an interface section, the module further comprising a housing having opposed side walls and opposed top and bottom walls forming an enclosure receiving the electrical component section therein, the electrical interconnection section comprising a plurality of contacts projecting beyond at least one side wall for contacting contacts of an adjacent module such that data and/or power signals can traverse the module from one side to the other, wherein the interconnection section comprises contacts having a resiliently biasable contact section with a contact surface protrudable beyond one of the side walls of the housing for contacting complementary contacts of an adjacent module and a fixed contact section, the fixed contact section having a contact surface exposed to the exterior of the module by a slot through the side wall opposed to the biasable contact, the fixed contact section being substantially immovable with respect to the side wall, the fixed and biasable contact section being integrally joined by a spring section extending therebetween.

2. An electronic module mounting and electrical interconnection system having an electronic module comprising a mounting section, an electrical interconnection section, an electronic or electrical component section, and an interface section, the module further comprising a housing having opposed side walls and opposed top and bottom walls forming an enclosure receiving the electrical component section therein, the electrical interconnection section comprising a plurality of contacts projecting beyond at least one side wall for contacting contacts of an adjacent module such that data and/or power signals can traverse the module from one side to the other, where the interface section comprises terminals for connection to external conductors to be interconnected to the electrical component section, characterized in that the interface section includes a connector housing with cavities for the terminals and the connector housing is pluggably inserted into a main body of the module that comprises the electrical or electronic component section and retained therein by latches.

3. An electrical interconnection section comprising a plurality of contacts in a housing having a side wall through which contact surfaces of the contacts project, wherein the interconnection section further comprises a contact guard having at least one protrusion extending beyond the contact surfaces and a base section engageable with a biasable portion of the contacts such that when the guard is depressed towards the housing side wall the contacts are depressed therewith.

4. The electrical interconnection section of claim 3 wherein the contact guard comprises a base section extending between a pair of the protrusions, the base section having spring engagement surfaces for engaging the contacts.

5. The electrical interconnection section of claim 4 wherein the base section has recessed spring engagement surfaces or slots for receiving the contact sections therethrough, for positioning of the contacts with respect to the contact guard.

6. The electrical interconnection section of claim 3 wherein the guard comprises mounting studs for mounting on a printed circuit board (PCB) of the electrical component section, the studs attached to the protrusions via a collapsible intermediate section.

7. The electrical interconnection section of claim 6 wherein the intermediate section comprises integral substantially V-shaped arms in mirror image disposition.

8. The electrical interconnection section of claim 3 wherein the protrusions have a substantially elliptical shape.

9. The electrical interconnection section of claim 3 wherein the contact guard engages the contacts proximate the biasable contact section of the contacts.

10. The electrical interconnection section of claim 9 wherein the contact guard engages either side of the biasable contact section, which has a convex shape directed towards the mating contact surface.

11. An electronic module mounting and electrical interconnection system having an electrical interconnection section according to any one of claims 18–25, further comprising an electronic module comprising a mounting section, an electronic or electrical component section, and an interface section, the module further comprising said housing which has opposed side walls and opposed top and bottom walls forming an enclosure receiving the electrical component section therein, the electrical interconnection section comprising a plurality of said contacts projecting beyond at least one side wall for contacting contacts of an adjacent module.

12. The module mounting and interconnection system of claim 11 wherein the other side wall opposed to the side wall through which the contact guard protrudes, comprises recesses for receiving the guard protrusions of an adjacent module thereto.

13. The electronic module mounting and electrical interconnection system interconnection system of claim 26 wherein the contacts have a fixed contact section, the fixed contact section having a contact surface exposed to the exterior of the module by a slot through the side wall opposed to the biasable contact section, the fixed contact section being substantially immovable with respect to the side wall, the fixed and biasable contact sections being integrally joined by a spring section extending therebetween.

14. The module mounting and interconnection system of claim 13 wherein the fixed contact section contact surface is recessed with respect to an outer surface of the side wall.

15. The module mounting and interconnection system of claim 13 wherein the contact is substantially planar and stamped from sheet metal.

16. The module mounting and interconnection system of claim 13 wherein the fixed contact section is positioned proximate a mounting portion for connection to the electronic/electrical component section.

17. The module mounting and interconnection system of claim 16 wherein the component section comprises a PCB, to which the mounting portion is securely mechanically and electrically attached.

18. The module mounting and interconnection system of claim 16 wherein the mounting section comprises compliant pin contacts for insertion through plated through-holes of the PCB, the pin contacts extending fro m the mounting section towards the biasable contact section.

19. The module mounting and interconnection system of claim 13 wherein the contact surface of the biasable contact section is arcuate and convex towards the exterior, and the fixed contact surface is substantially flat and of a length enabling adjustment to positional tolerance and some mating contact rub.

\* \* \* \* \*